(12) United States Patent
Chittipeddi et al.

(10) Patent No.: US 6,348,393 B1
(45) Date of Patent: Feb. 19, 2002

(54) CAPACITOR IN AN INTEGRATED CIRCUIT AND A METHOD OF MANUFACTURING AN INTEGRATED CIRCUIT

(75) Inventors: Sailesh Chittipeddi, Allentown, PA (US); Sailesh Mansinh Merchant, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/140,270

(22) Filed: Aug. 26, 1998

(51) Int. Cl.[7] ............... H01L 21/20; H01L 21/76; H01L 21/311
(52) U.S. Cl. ............... 438/386; 438/386; 438/430; 438/700; 438/398
(58) Field of Search ............... 438/427, 424, 438/700, 386, 430, 361, 393, 396, 398

(56) References Cited

U.S. PATENT DOCUMENTS

| | | | | |
|---|---|---|---|---|
| 4,829,015 A | * | 5/1989 | Schaber et al. | 437/31 |
| 4,879,257 A | * | 11/1989 | Patrick | 437/195 |
| 5,192,708 A | * | 3/1993 | Beyer et al. | 437/90 |
| 5,196,363 A | * | 3/1993 | Kang et al. | 437/52 |
| 5,788,854 A | * | 8/1998 | Desaigoudar et al. | 216/13 |
| 5,814,547 A | * | 9/1998 | Chang | 438/329 |
| 6,080,625 A | * | 6/2000 | Chittipedi et al. | 438/259 |
| 6,090,656 A | * | 7/2000 | Randazzo | 438/239 |

OTHER PUBLICATIONS

Patent No. 5,457,329, Filed on Aug. 23, 1994 and issued on Oct. 10, 1995 to Masana Harada.
Patent No. 4,988,639, filed on Sep. 28, 1989 and issued on Jan. 29, 1991 to Kunio Aomura.
Patent No. 5,776,817, filed on Jan. 3, 1997 and issued on Jul. 7, 1998 to Kuei–Chang Liang.

* cited by examiner

Primary Examiner—Richard Elms
Assistant Examiner—Adam Pyonin

(57) ABSTRACT

A new capacitor and a new method for fabricating the capacitor in an integrated circuit. The method uses fewer steps than those used in prior art processes. In accordance with the invention, trenches of differing depths are formed in a first insulating layer. One of the trenches is etched to expose a conducting layer formed under the insulating layer. Conductive material is deposited in the trenches to form a capacitor. The trenches are formed apart from each other.

1 Claim, 3 Drawing Sheets

CAPACITOR IN AN INTEGRATED CIRCUIT AND A METHOD OF MANUFACTURING AN INTEGRATED CIRCUIT

CROSS-REFERENCE TO RELATED APPLICATION

This application is related to U.S. Pat. No. 6,080,625, entitled, "Dual-Polysilicon Structures In Integrated Circuits And A Method For Making Them", which was filed on Aug. 26, 1998 and application Ser. No. 09/140,276, entitled, "A Method For Forming Dual-Polysilicon Structures Using A Built-In Stop Layer", which was filed on Aug. 26, 1998.

TECHNICAL FIELD

This invention relates to integrated circuits and, more specifically, to capacitor structures in integrated circuits and a method for making them.

BACKGROUND OF THE INVENTION

Capacitors are used extensively in electronic devices for storing an electric charge. The capacitors essentially comprise two conductive plates separated by an insulator. The capacitance, or amount of charge held by the capacitor per applied voltage, is measured in farads and depends upon the area of the plates, the distance between them, and the dielectric value of the insulator. Capacitors are used in filters, in analog-to-digital converters (ADCs), in memories, and various control applications. Capacitors in integrated circuits are usually fabricated from polysilicon, metal to polysilicon, or metal to polycide structures.

In addition, in any fabrication process, simplicity is an advantage. Thus, a fabrication method which can achieve the same or better quality product with the same cost of materials while using fewer steps is highly preferred, especially if elimination of fabrication steps reduces labor costs and the need for expensive manufacturing equipment. A new structure built from materials already being used in the fabrication process is preferred since it reduces materials development efforts and the need for expensive manufacturing equipment. Thus, it would be desirable to provide a process to manufacture high quality capacitors in integrated circuits using a simple manufacturing process.

SUMMARY OF THE INVENTION

The present invention is directed to a new capacitor and a new method for fabricating the capacitor in an integrated circuit. The method uses fewer steps than those used in prior art processes. In accordance with the invention, trenches of differing depths are formed in a first insulating layer. One of the trenches is etched to expose a conducting layer formed under the insulating layer. Conductive material is deposited in the trenches to form a capacitor. The trenches are formed apart from each other.

BRIEF DESCRIPTION OF THE DRAWING

The invention will be more fully understood from the following detailed description taken in connection with the accompanying drawing, in which.

DETAILED DESCRIPTION OF THE INVENTION

In accordance with the principles of the present invention, a new method for fabricating capacitors is characterized by a reduction in the number of steps required to build this type of structure. The process includes fabricating at least two trenches of differing depths and then forming conductive materials in the trenches to form a capacitor. Advantageously, this method may produce a structure with a planar or flattened topology. The individual steps of the new method utilize standard processing techniques.

Figure 1:
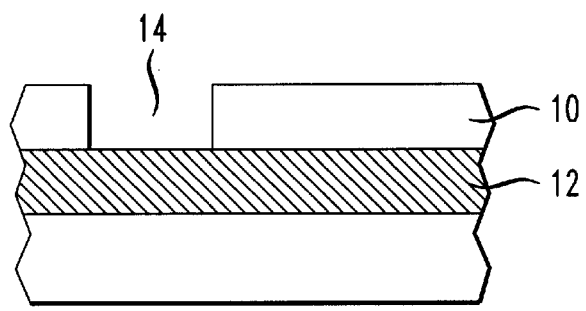
FIGS. 1 to 3 illustrate an integrated circuit during successive stages of manufacture according to a first illustrative embodiment of the present invention.

The first illustrative embodiment is described below with reference to FIGS. 1 to 3. Formed on the substrate 12 is an insulating layer 10. Insulating layer 10 may be $SiO_2$ and may have a substantially uniform depth. The substrate is a conducting material such as tungsten, aluminum, copper, polysilicon, or other material suitable for use as a conductor and as is known to those skilled in this art. There may be one or more layers formed below the substrate 12. The thickness of the insulating layer 10 varies based on the particular process and technology being used and the surface topology of the substrate 12. At least one trench 14 is then formed by patterning the area to be etched using standard semiconductor photo-lithographic techniques and then etched (for example, chemically) to form the trench 14. In particular, the trench 14 is etched to a depth equal to that of the insulating layer 10. In other words, the trench 14 is etched to reveal the surface of the conducting material 12.

Illustratively, trench 14 is formed by: 1) applying a layer of resist material on the insulating layer 10; 2) exposing the resist material to an energy source which passes through a pattern mask; 3) removing areas of resist to form the pattern in the resist; 4) etching the trench 14; and 5) removing the remaining resist material. The energy source may be an e-beam, light source, or other suitable energy source.

Figure 2:
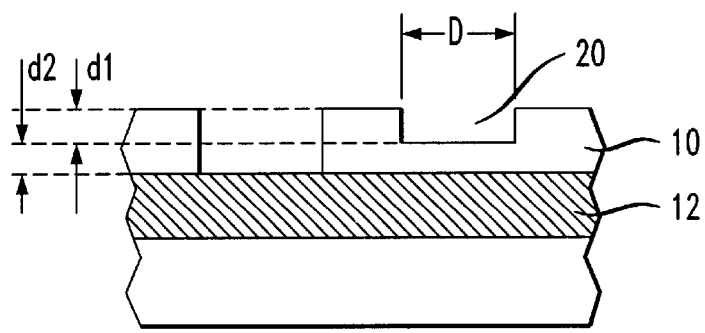

After formation of the first trench 14, a second trench 20, shown in FIG. 2, is formed in the insulating layer 10. The second trench 20 has a depth that is less than the depth of the first trench 14, and therefore has a base that sits above a remaining thickness of the insulating layer 10. The second trench 20 may be formed using the process described above to form the first trench 14. The depth d1 of second trench 20 or the thickness d2 of the insulating layer 10 remaining underneath the second trench 20 is dependent upon the desired characteristics of the structure being fabricated. The thickness d2 of the insulating layer 10 remaining underneath may be varied to change capacitance. Alternatively, the diameter D of the trench 20 may be increased or decreased to change capacitance or additional trenches 20 (or 120) may be formed and electrically connected. In other words, the total cross-sectional area of the trench 20 may be increased or decreased. In addition, multiple capacitors may be formed and interconnected as desired using this process.

Figure 3:
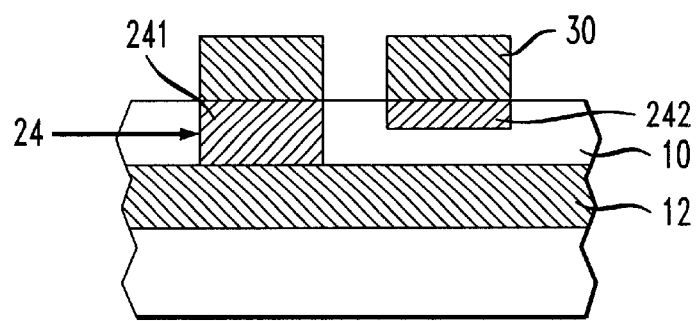
Figure 4:
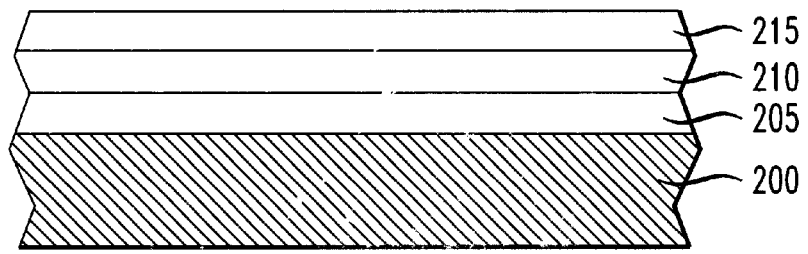
FIGS. 4 to 9 illustrate an integrated circuit during successive stages of manufacture according to a second embodiment of the present invention.

Using standard processing techniques, a conductive layer 24, shown in FIG. 3, is then formed in trenches 14 and 20. The conducting layer 24 is a conducting material such as tungsten, aluminum, copper, polysilicon, or other conducting material suitable for use as a conductor as is known to those skilled in this art. After being deposited in a blanket fashion, the conducting layer 24 is processed to make the surface of the conducting layer 24 co-planar or substantially co-planar with the surface of the first insulating layer 10 to form plugs 241 and 242. For example, this is accomplished by a conventional chemical-mechanical polishing (CMP) or other planarization techniques.

Subsequently, a second conducting layer 30, shown in FIG. 3, is blanket deposited on the planarized surfaces of the insulating layer 10 and the first conducting layer 24. The second conducting layer 30 is a conducting material such as tungsten, aluminum, copper, polysilicon, or other conducting material suitable for use as a conductor and as is known to those skilled in this art. The second conducting layer 30 is patterned as is described above and as is well known to form, for example, runners contacting the plugs 241 and 242 formed in trenches 14 ad 20.

The process described above may be used to form metal-oxide-metal (MOM) capacitors. Alternatively, the process described above may be used to form metal to polysilicon or metal to polycide capacitors. In this embodiment, the substrate may be polysilicon or polycide and the first and second conducting layers are metals such as tungsten.

In the process described above, the conductive layers 24 and 30 may be formed at substantially the same time. For example, a conducting material may be blanket deposited over the insulating layer 10 and in trenches 14 and 20. Then, the conducting material is patterned as is described above and as is well known to form, for example, runners and the plugs. In this way, processing steps may be eliminated. Further, the first and second conducting layers 24 and 30 may be formed of the same or different materials. In addition, the first conducting layer 24 may be formed from multiple layers of different or the same material.

A second illustrative embodiment is described below with reference to FIGS. 4–9 where an insulating layer 205 is formed on a substrate 200. Insulating layer 205 may be $SiO_2$ and have a substantially uniform depth. The substrate 200 is a conducting material such as tungsten, aluminum, copper, polysilicon, or other conducting material suitable for use as a conductor as is known to those skilled in this art. There may be one or more layers formed below the substrate 200. The thickness of the insulating layer 205 varies based on the particular process and technology being used as described above.

Figure 5:
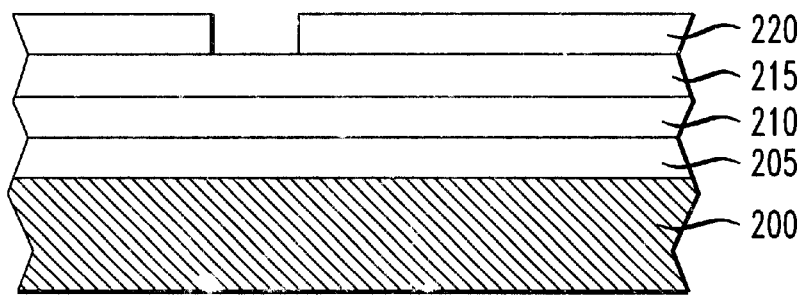
Figure 6:
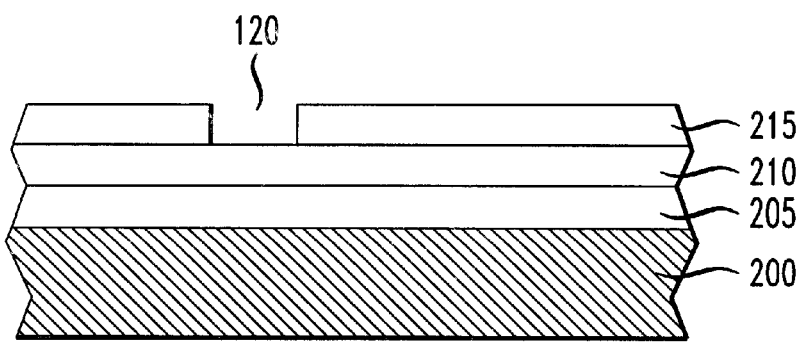

Subsequently, a stop layer 210 is formed on the insulating layer 205. The stop layer 210 is, for example, TiN. The stop layer 205 is an etch stop layer as is described below. A second insulating layer 215 is formed on the stop layer 205. The second insulating layer is, for example, $SiO_2$. Next, a resist 220, shown in FIG. 5, is formed on the second insulating layer 215 and patterned as is described above and as is well known in the art. The second insulating layer 215 is etched to form trench 120, shown in FIG. 6. The etch process is a selective etch process that etches the insulating layer 215 at a higher or substantially higher rate than the stop layer 210. In other words, the stop layer 210 is resistant to the etch process used to etch insulating layer 215. By using this process, the depth of trench 120 formed during the etch process may be precisely controlled.

Figure 7:
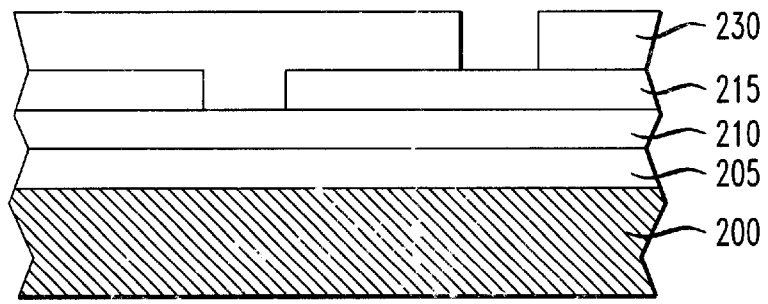
Figure 8:
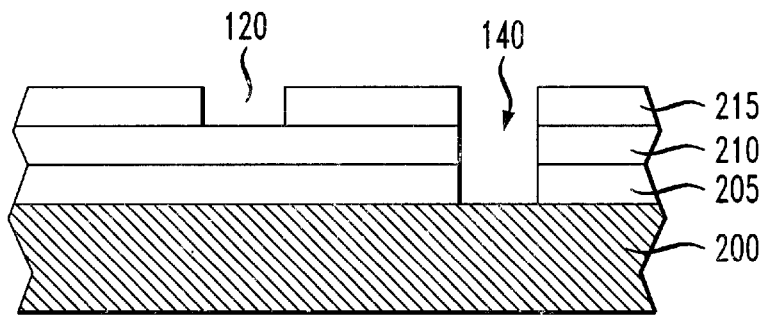
Figure 9:
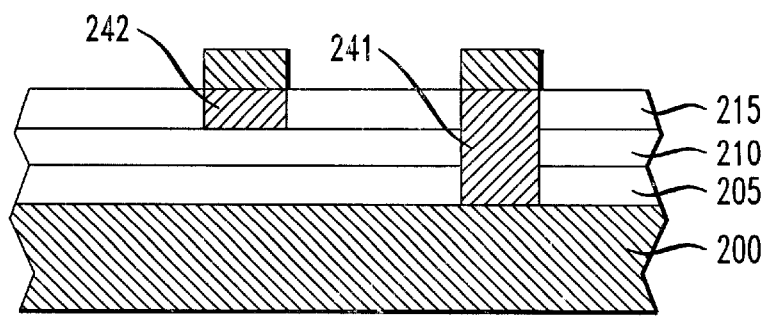

Next, as is shown in FIG. 7, a second resist layer 230 is formed on the second insulating layer 215. The second resist layer 230 is patterned as is described above and as is well known. The second insulating layer 215, the stop layer 210, and the first insulating layer 205 are etched using a process that selectively etches the materials of each layer to form trench 140, shown FIG. 8. In other words, stop layer 210 is not resistant to the etching process used to form trench 140. After etching, the remaining portions of the second resist layer 230 are removed. The trench 140 is similar to the trench 14 shown in FIGS. 1–3 and trench 120 is similar to the trench 20 shown in FIGS. 1–3. Once trenches 140 and 120 have been formed, layers similar to layers 24 and 30 may be formed as described above in the first embodiment and shown in FIG. 9 to form a capacitor.

Finally, it is to be understood that although the invention is disclosed herein in the context of particular illustrative embodiments, those skilled in the art will be able to devise numerous alternative arrangements. Such alternative arrangements, although not explicitly shown or described herein, embody the principles of the present invention and are thus within its spirit and scope.

We claim:

1. A method of manufacturing an integrated circuit that includes a capacitor, the method comprising:

providing a conductive substrate;

forming an insulating layer above the conductive substrate;

forming a barrier layer above the first insulating layer;

forming a second insulating layer above the barrier layer;

forming a first trench through the first insulating layer, the barrier layer, and the second insulating layer to expose a portion of the conductive substrate;

forming a second trench in the second insulating but not in the first insulating layer; and providing a conductive material in the second trench to form the capacitor including the conductive material, the conductive substrate, and the portion of the first insulating layer formed therebetween.

* * * * *